United States Patent
Nakaki et al.

(10) Patent No.: US 10,304,851 B2
(45) Date of Patent: May 28, 2019

(54) SEMICONDUCTOR MEMORY DEVICE

(71) Applicant: TOSHIBA MEMORY CORPORATION, Tokyo (JP)

(72) Inventors: Hiroshi Nakaki, Yokkaichi Mie (JP); Yosuke Mitsuno, Yokkaichi Mie (JP); Tatsuya Okamoto, Inabe Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/909,494

(22) Filed: Mar. 1, 2018

(65) Prior Publication Data

US 2019/0081064 A1 Mar. 14, 2019

(30) Foreign Application Priority Data

Sep. 8, 2017 (JP) .................................. 2017-173268

(51) Int. Cl.
*H01L 27/11582* (2017.01)
*H01L 21/02* (2006.01)
(Continued)

(52) U.S. Cl.
CPC .... *H01L 27/11582* (2013.01); *G11C 16/0466* (2013.01); *G11C 16/0483* (2013.01); *G11C 16/10* (2013.01); *G11C 16/14* (2013.01); *G11C 16/26* (2013.01); *H01L 29/04* (2013.01); *H01L 29/1037* (2013.01); *H01L 29/1095* (2013.01); *H01L 29/513* (2013.01); *H01L 29/518* (2013.01); *H01L 21/0217* (2013.01); *H01L 21/02164* (2013.01); *H01L 21/02178* (2013.01); *H01L 21/02238* (2013.01); *H01L 21/02255* (2013.01); *H01L 21/02532* (2013.01);
(Continued)

(58) Field of Classification Search
CPC ..................... H01L 27/11582; H01L 21/02164
See application file for complete search history.

(56) References Cited

U.S. PATENT DOCUMENTS 7,615,453 B2   11/2009  Minami
8,203,884 B2    6/2012  Kito et al.
(Continued)

FOREIGN PATENT DOCUMENTS

JP     2011-023687 A    2/2011
JP        5222540 B2    6/2013
JP        5825988 B2   12/2015

*Primary Examiner* — Marc Anthony Armand
(74) *Attorney, Agent, or Firm* — Kim & Stewart LLP

(57) ABSTRACT

A semiconductor memory device includes a first semiconductor well of a first conductivity type in a memory cell region and a contact region of a substrate, a second semiconductor well of a second conductivity type in the first semiconductor well in the contact region, a plurality of electrode films stacked on the first semiconductor well and spaced from one another in a first direction, the plurality of electrode films extending in a second direction within the memory cell region into the contact region, a first semiconductor pillar extending in the second direction through the plurality of electrode films in the memory cell region, a second semiconductor pillar extending in the second direction through at least one electrode film in the contact region, a charge storage film between the first semiconductor pillar and each electrode film, an insulating film between the second semiconductor pillar and the at least one electrode film.

9 Claims, 17 Drawing Sheets

(51) Int. Cl.
    *H01L 29/10*     (2006.01)
    *H01L 29/51*     (2006.01)
    *H01L 29/04*     (2006.01)
    *G11C 16/04*     (2006.01)
    *G11C 16/10*     (2006.01)
    *G11C 16/26*     (2006.01)
    *G11C 16/14*     (2006.01)
    *H01L 21/768*     (2006.01)
    *H01L 27/11565*     (2017.01)
    *H01L 27/11573*     (2017.01)
    *H01L 27/11568*     (2017.01)
    *H01L 23/528*     (2006.01)
    *H01L 23/522*     (2006.01)
    *H01L 21/265*     (2006.01)
    *H01L 29/167*     (2006.01)
    *H01L 21/28*     (2006.01)

(52) U.S. Cl.
    CPC .. *H01L 21/26513* (2013.01); *H01L 21/28282* (2013.01); *H01L 21/76843* (2013.01); *H01L 23/528* (2013.01); *H01L 23/5226* (2013.01); *H01L 27/11565* (2013.01); *H01L 27/11568* (2013.01); *H01L 27/11573* (2013.01); *H01L 29/167* (2013.01)

(56) References Cited

U.S. PATENT DOCUMENTS

| | | |
|---|---|---|
| 8,564,050 B2 | 10/2013 | Park et al. |
| 9,355,913 B2 | 5/2016 | Park et al. |
| 2009/0230450 A1* | 9/2009 | Shiino ............... H01L 27/11578 257/314 |
| 2017/0148804 A1* | 5/2017 | Lee ................... H01L 27/11578 |

* cited by examiner

SEMICONDUCTOR MEMORY DEVICE

CROSS-REFERENCE TO RELATED APPLICATION

This application is based upon and claims the benefit of priority from Japanese Patent Application No. 2017-173268, filed Sep. 8, 2017, the entire contents of which are incorporated herein by reference.

FIELD

Embodiments described herein relate generally to a semiconductor memory device.

BACKGROUND

In existing stacked semiconductor memory devices, memory cells are integrated in a three-dimensional manner. In such a stacked semiconductor memory device, referred to as a stacked body, electrode films and insulating films are alternately stacked on a semiconductor substrate, and semiconductor pillars penetrate through the stacked body. Memory cell transistors are formed at intersections between the electrode films and the semiconductor pillars. There is a need for ensuring reliability of memory cell transistors in such stacked semiconductor memory devices.

DETAILED DESCRIPTION

In general, according to one embodiment, a semiconductor memory device includes a first semiconductor well of a first conductivity type in a memory cell region and a contact region of a substrate, a second semiconductor well of a second conductivity type in the first semiconductor well in the contact region, a plurality of electrode films stacked on the first semiconductor well and spaced from one another in a first direction, the plurality of electrode films extending in a second direction within the memory cell region into the contact region, a first semiconductor pillar extending in the second direction through the plurality of electrode films in the memory cell region, a second semiconductor pillar extending in the second direction through at least one electrode film of the plurality in the contact region, a charge storage film between the first semiconductor pillar and each electrode film of the plurality, an insulating film between the second semiconductor pillar and the at least one electrode film of the plurality.

First Embodiment

Hereinafter, a semiconductor memory device according to a first embodiment will be described with reference to FIGS. 1, 2, 3A, 3B, and 4.

It should be noted that the drawings are schematic and are drawn as appropriate with exaggeration and omissions for purposes of explanatory convenience. In general, components are not drawn to scale. In addition, the number of components, the dimensional ratio been different components, or the like does not necessarily match between different drawings.

The semiconductor memory device according to the embodiment is a stacked NAND flash memory.

Figure 1:
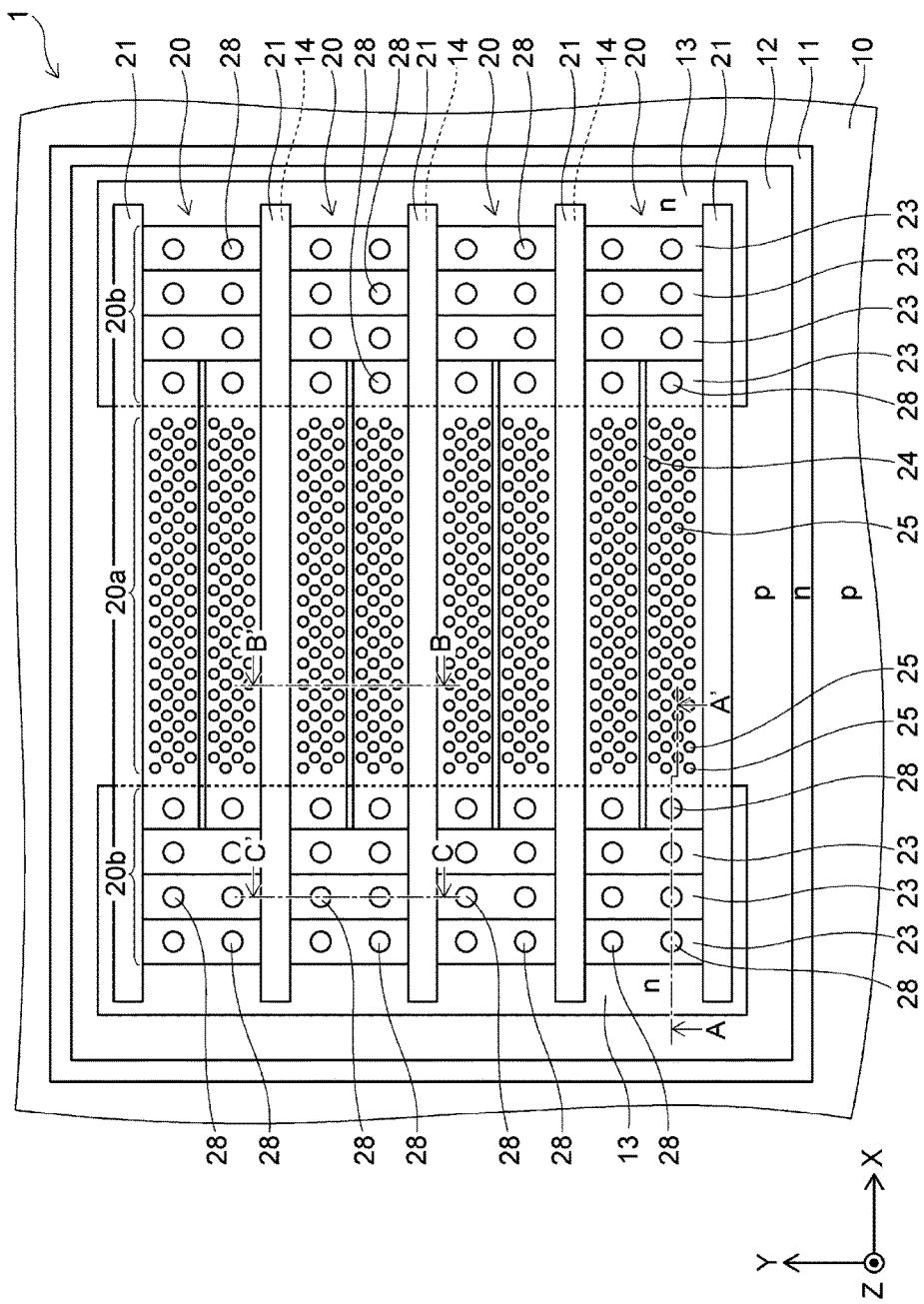
FIG. 1 is a plan view of a semiconductor memory device according to a first embodiment.

FIG. 1 is a plan view of a semiconductor memory device 1 according to the first embodiment. As illustrated in FIG. 1, the semiconductor memory device 1 is provided with a silicon substrate 10 having p-type conductivity. The silicon substrate 10 is formed of, for example, single crystal silicon.

In the following description, an XYZ orthogonal coordinate system is adopted for convenience of description. Two directions parallel to an upper surface 10a of the silicon substrate 10 (see FIG. 2) and orthogonal to each other are taken as an "X direction" and a "Y direction", and a direction perpendicular to the upper surface 10a of the silicon substrate 10 is taken as a "Z direction". In the Z direction, a direction from the inside of the silicon substrate 10 toward the upper surface 10a is referred to as an "up", and the opposite direction is referred to as a "down", but this differentiation is for convenience and is independent of the direction of gravity.

In the following description, a "silicon substrate" refers to a substrate containing silicon (Si) as a main component. This descriptive convention is also similar for described elements and components, and when the name of the element includes a material name (e.g., silicon), the element or component so named comprises the material as a main component. In general, since silicon is a semiconductor material, a silicon substrate may be referred to as a semiconductor substrate and considered as such and as disclosure of a broader class of materials having the same or similar characteristics as silicon in this context. This applies similarly to other component names or descript, and in general, unless otherwise specified, a particularly disclosed material for a particular component is a disclosure of suitable characteristics of other materials which might be adopted for the particular component.

An n-type well (n-well) 11 having n-type conductivity is formed in an upper part of the silicon substrate 10, a p-type well (p-well) 12 having p-type conductivity is formed in an upper part of the n-well 11, and an n-type region 13 having n-type conductivity is formed in a portion of an upper part of the p-well 12. An $n^+$-type contact region 14 having $n^+$-type conductivity is formed in another portion of the upper part of the p-well 12.

A plurality of stacked bodies 20 is provided on the p-well 12 and the n-type region 13. The plurality of stacked bodies 20 is arranged along a Y direction. A conductive plate 21 is provided between two adjacent stacked bodies 20. The conductive plate 21 has a plate shape spread in an XZ plane. The $n^+$-type contact region 14 is formed in a region directly below the conductive plate 21 and is connected to a lower end of the conductive plate 21.

Figure 2:
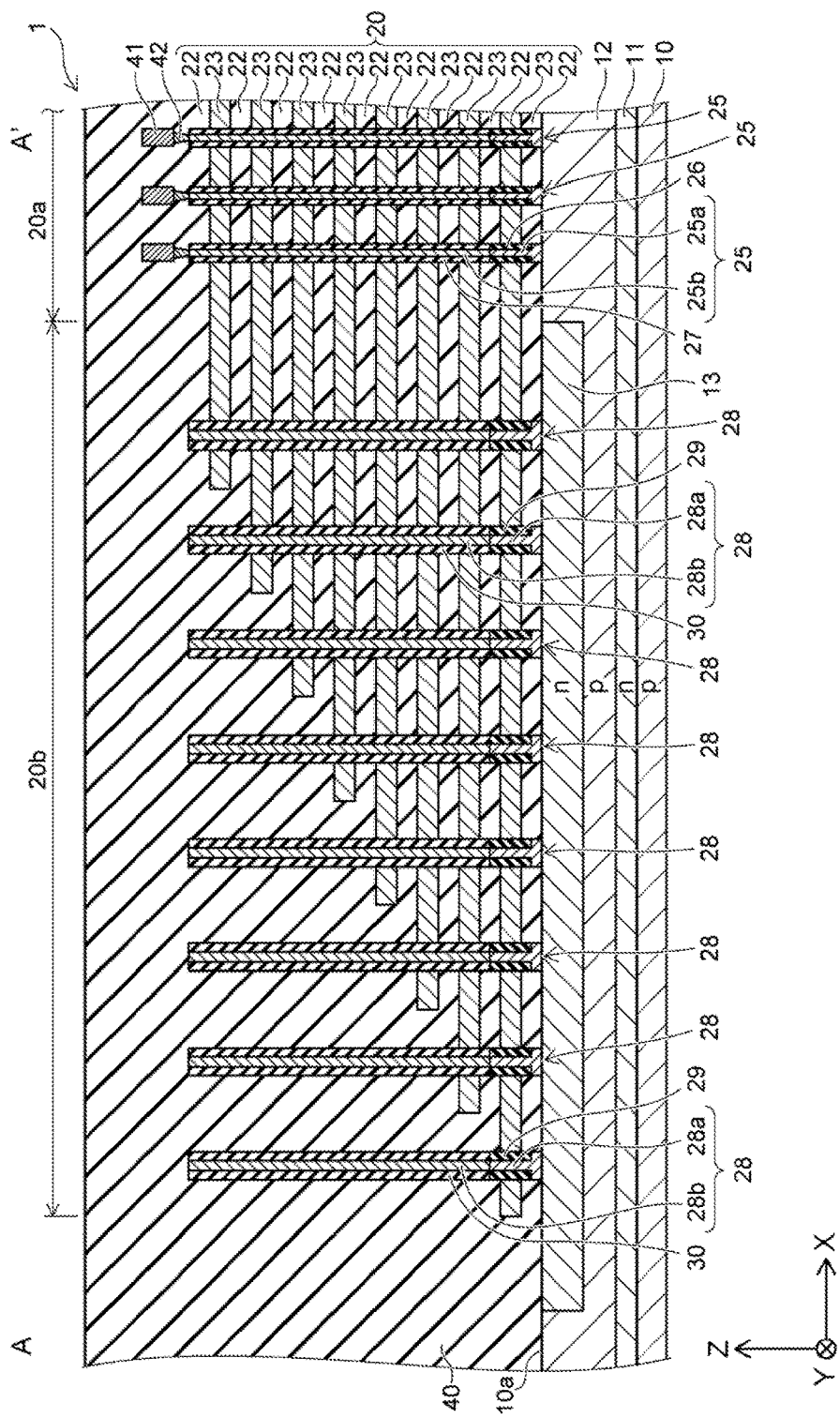
FIG. 2 is a cross-sectional view taken along line A-A' illustrated in FIG. 1.
Figure 3A:
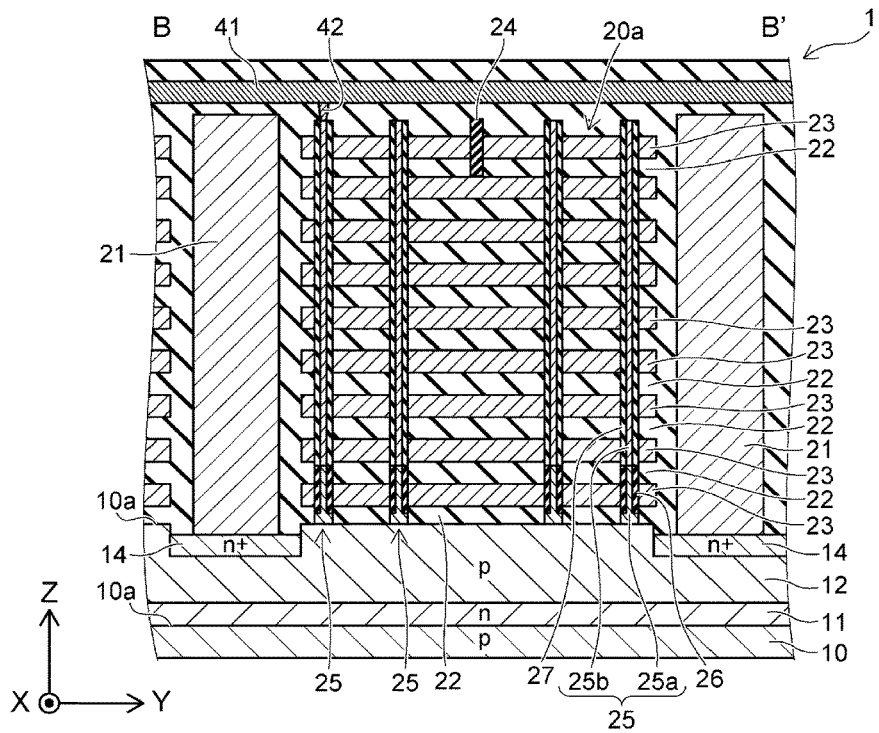
FIG. 3A is a cross-sectional view taken along line B-B' illustrated in FIG. 1.
Figure 3B:
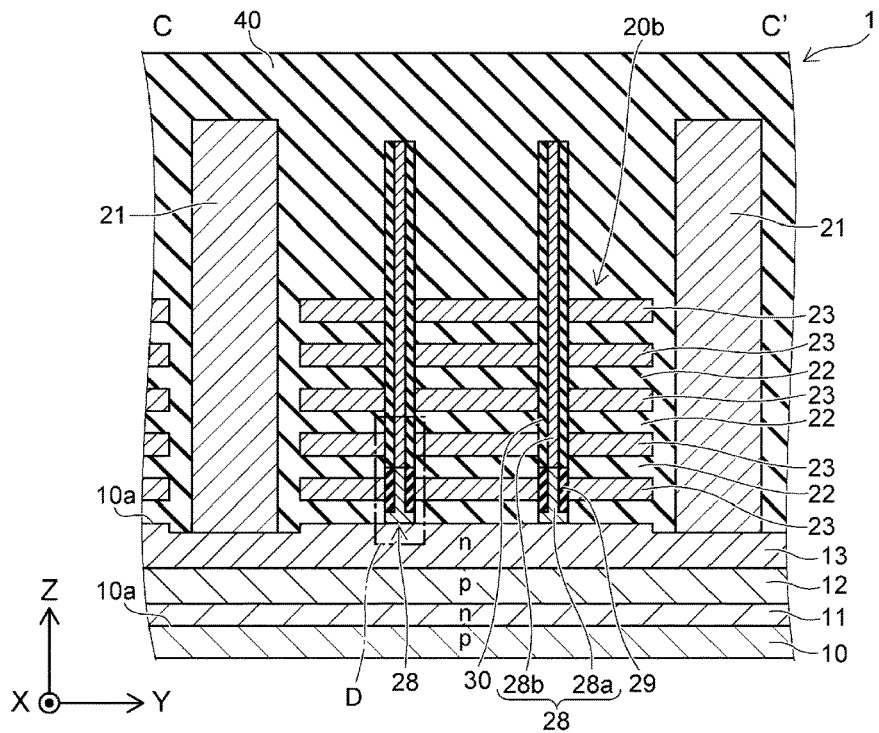
FIG. 3B a cross-sectional view taken along the line C-C' illustrated in FIG. 1.
Figure 4:
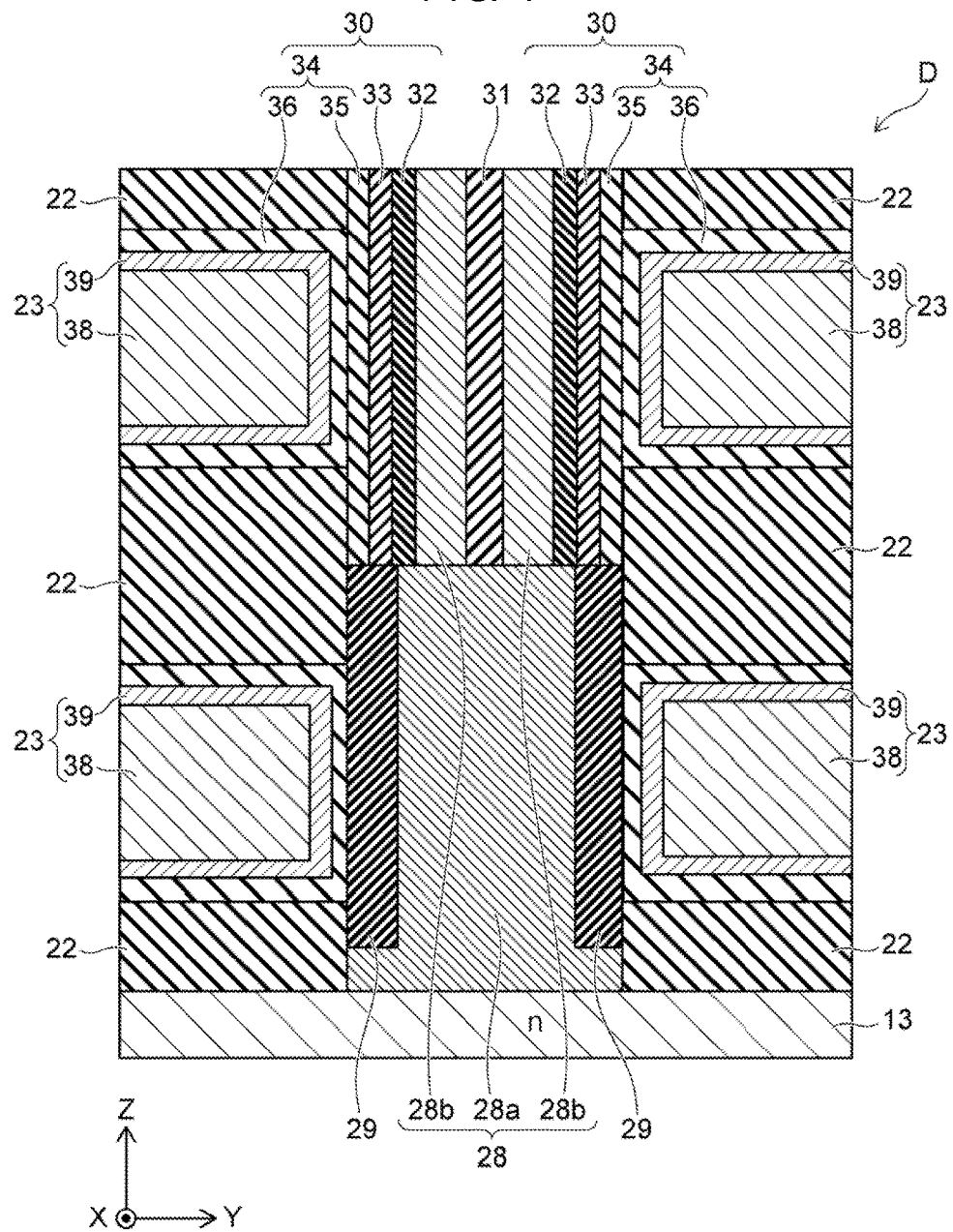
FIG. 4 is a cross-sectional view of a region D in FIG. 3B.

FIG. 2 is a cross-sectional view taken along the line A-A' illustrated in FIG. 1. FIG. 3A is a cross-sectional view taken along the line B-B' illustrated in FIG. 1. FIG. 3B is a cross-sectional view taken along the line C-C' illustrated in FIG. 1. FIG. 4 is a cross-sectional view of a region D in FIG. 3B. As illustrated in FIG. 2 and FIGS. 3A and 3B, the stacked body 20 includes a plurality of insulating films 22 and a plurality of electrode films 23 alternating one by one in layers. A middle portion in an X direction of the stacked body 20 is referred to as a cell portion or a memory cell region 20a. The electrode films 23 extends over the cell portion 20a. In both end portions (also referred to as contact regions) 20b in the X direction of the stacked body 20, the electrode films 23 form a staircase shape in which a terrace is provided for each electrode film 23. A silicon oxide member 24 extending in the X direction is provided in a middle of the stacked body 20 in a Y direction near a top of the stacked body 20. The uppermost electrode film 23 is divided into two parts by the silicon oxide member 24. In some embodiments, more than one of the electrode films 23 from the top may be divided into two parts by the silicon oxide member 24.

A silicon pillar 25 made of, for example, an i-type (intrinsic type) polysilicon is provided in the cell portion 20a of the stacked body 20. The silicon pillar 25 has substantially a cylindrical shape in which a lower portion 25a is closed. The lower portion 25a of the silicon pillar 25 is surrounded by the lowermost electrode film 23. A silicon oxide film 26 is provided on a side surface of the lower portion 25a. A portion of the silicon pillar 25 excluding the lower portion 25a, that is, a portion surrounded by the second or higher electrode films 23 from the bottom is referred to as an upper portion 25b. A core member 31 (see FIG. 4) made of, for example, silicon oxide (SiO) is provided in the upper portion 25b. A memory film 27 is provided on a side surface of the upper portion 25b.

Silicon pillars 28 made of, for example, an i-type (intrinsic type) polysilicon are provided in the both end positions 20b of the stacked body 20. The silicon pillar 28 has a larger diameter than the silicon pillar 25. The silicon pillar 28 has substantially a cylindrical shape in which a lower portion 28a is closed. The lower portion 28a is surrounded by the lowermost electrode film 23. A silicon oxide film 29 is provided on a side surface of the lower portion 28a. A portion of the silicon pillar 28 excluding the lower portion 28a, that is, a portion surrounded by the second or higher electrode films 23 from the bottom is referred to as an upper portion 28b. The upper portion 28b has substantially the same thickness as the upper portion 25b of the silicon pillar 25. A core member 31 (see FIG. 4) made of, for example, silicon oxide is provided in the upper portion 28b. A memory film 30 is provided on a side surface of the upper portion 28b.

As illustrated in FIG. 4, in the memory film 30, a tunnel insulating film 32, a charge storage film 33, and a block insulating film 34 are provided in the order from the upper portion 28b. The tunnel insulating film 32 is typically an insulating film, but may be any film through which a tunnel current flows when a predetermined voltage is applied within a range of a drive voltage of the semiconductor memory device 1. For example, the tunnel insulating film 32 is a single-layered silicon oxide film, or an oxide-nitride-oxide (ONO) film in which a silicon oxide layer, a silicon nitride layer, and a silicon oxide layer are stacked in this order. The charge storage film 33 is a film that can store electronic charges. For example, the charge storage film 33 is formed of a material, such as silicon nitride (SiN), including a trap site for electrons The block insulating film 34 is a film through which a current does not flow when a predetermined voltage is applied within the range of the drive voltage of the semiconductor memory device 1. In the example embodiments described herein, the block insulating film 34 is a double layered film of a silicon oxide layer 35 and an aluminum oxide layer 36. The tunnel insulating film 32, the charge storage film 33, and the silicon oxide layer 35 each have a cylindrical shape which surrounds the upper portion 28b of the silicon pillar 28. The aluminum oxide layer 36 is provided on a lower surface, an upper surface, and side surfaces of the electrode film 23, the side surfaces facing the silicon pillars 25 and 28.

The memory film 27 has the same configuration as the memory film 30. The memory film 27 has substantially the same thickness as the memory film 30. However, the core member 31 disposed in the memory film 27 is thinner than the core member 31 disposed in the memory film 30. Accordingly, the memory film 27 has an inner diameter smaller than that of the memory film 30, and the memory film 27 also has an outer diameter smaller than that of the memory film 30.

On the electrode film 23, a main body 38 and a barrier metal layer 39 formed of, for example, tungsten (W) are provided. The barrier metal layer 39 is, for example, a double layered film in which a titanium (Ti) layer and a titanium nitride layer (TiN) are stacked, and is provided on an upper surface, a lower surface, and side surfaces of the main body 38, the side surfaces facing the silicon pillars 25 and 28.

As illustrated in FIGS. 1 and 2, the n-type region 13 is formed in a region directly below the both end portions 20b of the stacked body 20, but is not disposed in a region directly below the cell portion 20a. For this region, the silicon pillar 25 is disposed outside an outer edge of the n-type region 13 when viewed from a Z direction. The lower end of the silicon pillar 25 is connected to the p-well 12. The silicon pillar 28 is disposed inside the outer edge of the n-type region 13 when viewed from the Z direction. The lower end of the silicon pillar 28 is connected to the n-type region 13.

An interlayer insulating film 40 formed of, for example, silicon oxide, is provided on an upper side and a lateral side of the stacked body 20 so as to cover the stacked body 20. On the stacked body 20, a bit line 41 extending in the Y direction is provided. The bit line 41 is connected to an upper end of the silicon pillar 25 via a plug 42. An upper end of the silicon pillar 28 is not connected to any circuit. Further, circuit elements such as CMOS are formed on the upper surface of the silicon substrate 10 and around the stacked body 20 in the interlayer insulating film 40, and constitute a peripheral circuit.

An operation of the semiconductor memory device according to the first embodiment will be described below.

In the semiconductor memory device 1 according to the embodiment, a memory cell including Metal-Oxide-Semiconductor Field-Effect Transistor (MOSFET) is formed at every intersection between the silicon pillar 25 and the electrode film 23. Data is stored when a threshold voltage of the memory cell is applied. The silicon pillar 28 functions as a pillar for the stacked body 20, and no memory cell is formed therein. A method of writing, reading, and erasing data to and from the memory cell will be described below.

In a write operation, a positive write potential is applied to the selected electrode film 23, a ground potential is applied to the selected silicon pillar 25 via the bit line 41, and thus electrons are injected from the silicon pillar 25 to the charge storage film 33 via the tunnel insulating film 32. As the electrons are stored in the charge storage film 33, a threshold voltage of the selected memory cell increases. In this manner, data is written in the selected memory cell.

In a read operation, a voltage is applied between the bit line 41 and the conductive plate 21 in a state where a read potential is applied to the electrode film 23 of the memory cell to be read. Then, a current flowing between the bit line 41 and the conductive plate 21 is detected, and thus the threshold voltage of the memory cell is determined. In this manner, data of the selected memory cell is read out.

In an erasing operation, a ground potential is applied to all the electrode films 23 belonging to one stacked body 20, and from contacts (not illustrated) disposed around the stacked body 20, a positive erasing potential is applied to the silicon pillar 25 via the p-well 12. Thus, the electrons stored in the charge storage film 33 are extracted to the silicon pillar 25 via the tunnel insulating film 32. As a result, the electrons stored in the charge storage film 33 are eliminated, and the threshold voltage of the memory cell lowers. In this manner, data of all the memory cells belonging to a certain stacked body 20 is erased collectively.

Since the n-type region 13 is interposed between the p-well 12 and the silicon pillar 28, the positive erasing potential is hardly transmitted to the i-type silicon pillar 28 even when being applied to the p-well 12.

Effects of the semiconductor memory device 1 according to the first embodiment will be described below.

In the semiconductor memory device 1 according to the embodiment, since the n-type region 13 is provided in the region directly below both end portions 20b of the stacked body 20, the positive erasing potential applied to the p-well 12 is transmitted to the silicon pillar 25 to erase the data stored in the memory cell, but is hardly transmitted to the silicon pillar 28. For this reason, the silicon pillar 28 and the electrode film 23 is not subject to a high voltage inbetween, and the memory film 30 is not damaged. As a result, the semiconductor memory device according to the embodiment has high reliability.

In contrast, if the n-type region 13 is not provided, the erasing potential is also applied to the silicon pillar 28 in the erasing operation. The silicon pillar 28 having a larger diameter than that of the silicon pillar 25 is fabricated in the same process as the silicon pillar 25. Since conditions of this fabrication process are optimized for the silicon pillar 25 in the memory cell, the silicon pillar 28 has shape accuracy lower than that of the silicon pillar 25. As a result, the shape of the silicon pillar 28 tends to become irregular, and when the erasing potential is repeatedly applied to the silicon pillar 28, an electric field concentration occurs in the memory film 30 and the memory film 30 may be broken. For this reason, the reliability of the semiconductor memory device is lowered.

The n-type region 13 may be fabricated using an impurity implantation process for forming the peripheral circuit. Thus, there is no need to provide an additional fabrication process for forming the n-type region 13.

Second Embodiment

Hereinafter, a semiconductor memory device according to a second embodiment will be described with reference to FIGS. 5, 6A, and 6B. The same reference numerals are used for the components that are substantially the same as those of the first embodiment, and the description of repeated components may be omitted.

Figure 5:
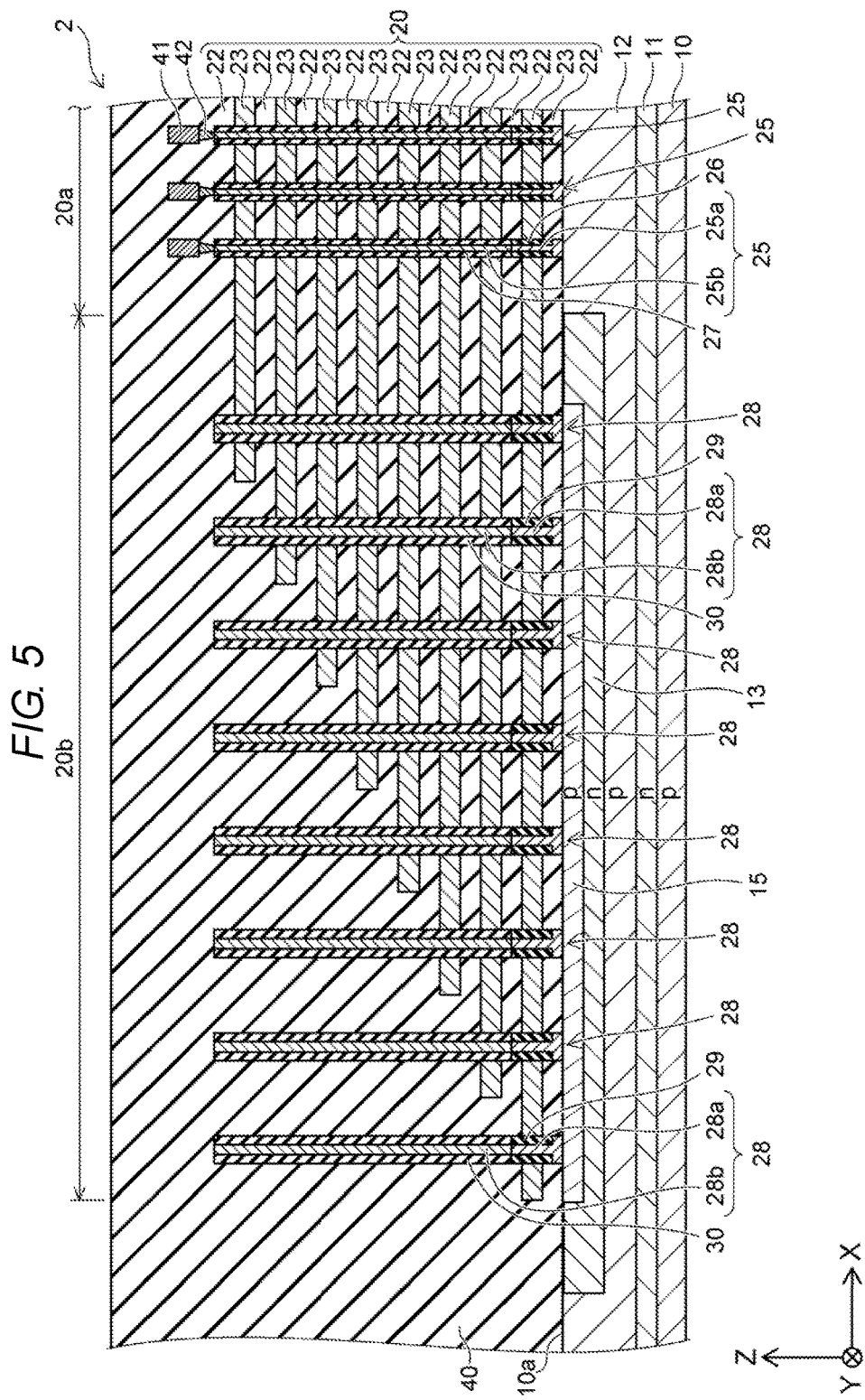
FIG. 5 is a cross-sectional view of a semiconductor memory device according to a second embodiment.

FIG. 5 is a cross-sectional view of a semiconductor memory device 2 according to the second embodiment.

Figure 6A:
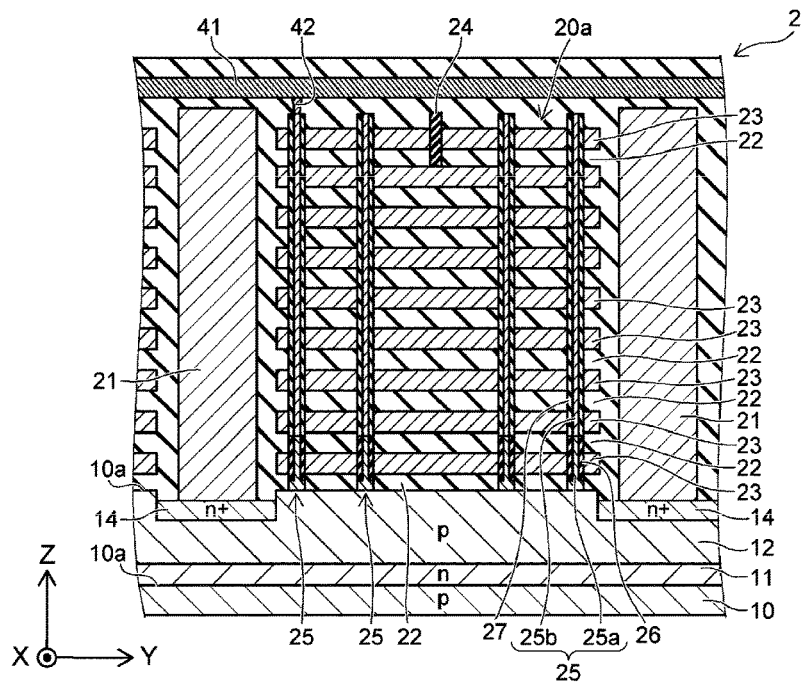
FIG. 6A is a cross-sectional view of a cell portion of a stacked body.

FIG. 6A is a cross-sectional view of a cell portion of a stacked body in the semiconductor memory device 2. FIG. 6B is a cross-sectional view of an end portion of the stacked body in the semiconductor memory device 2.

Figure 6B:
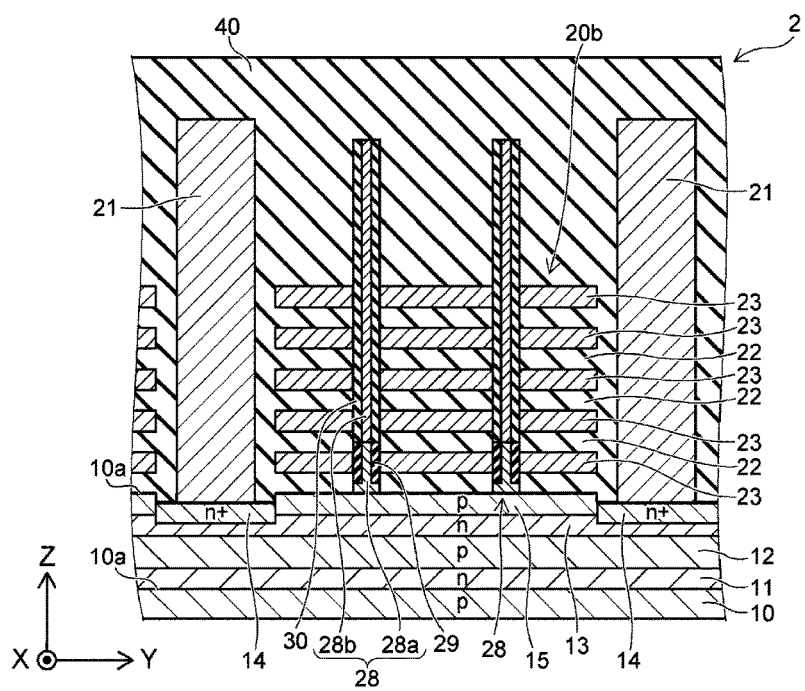
FIG. 6B is a cross-sectional view of an end of the stacked body.

In a semiconductor memory device 2 according to the second embodiment, as illustrated in FIG. 5 and FIGS. 6A and 6B, a p-type region 15 having p-type conductivity is provided in an upper part of an n-type region 13 in addition to the configuration of the semiconductor memory device 1 (see FIGS. 1 to 4) according to the first embodiment described above. When viewed from the Z direction, the p-type region 15 is disposed inside an outer edge of the n-type region 13, and is connected with a lower end of a silicon pillar 28. A lower end of a silicon pillar 25 is connected to a p-well 12.

In the semiconductor memory device 2, the n-type region and the p-type region 15 are interposed between the conductive plate 21 and the silicon pillar 28. For this reason, when a ground potential is applied to an electrode film 23 and a positive erasing potential is applied to the p-well 12, a potential of the n-type region 13 rises, but the potential is not transmitted to the p-type region 15, whereby a depletion layer is formed between the n-type region 13 and the p-type region 15. Thus, the erasing potential is not applied to the silicon pillar 28, and a high voltage is not applied between the silicon pillar 28 and the electrode film 23. As a result, the memory film 30 can be prevented from being damaged by the erasing operation and a leak current can be prevented from flowing between the silicon pillar 28 and the electrode film 23.

Configurations, operations, and effects other than those described above in the embodiment are the same as those in the first embodiment.

Third Embodiment

Hereinafter, a semiconductor memory device according to a third embodiment will be described with reference to FIGS. 7, 8A, and 8B. The same reference numerals are used for the components that are substantially the same as those of the first embodiment, and the description of repeated components may be omitted.

Figure 7:
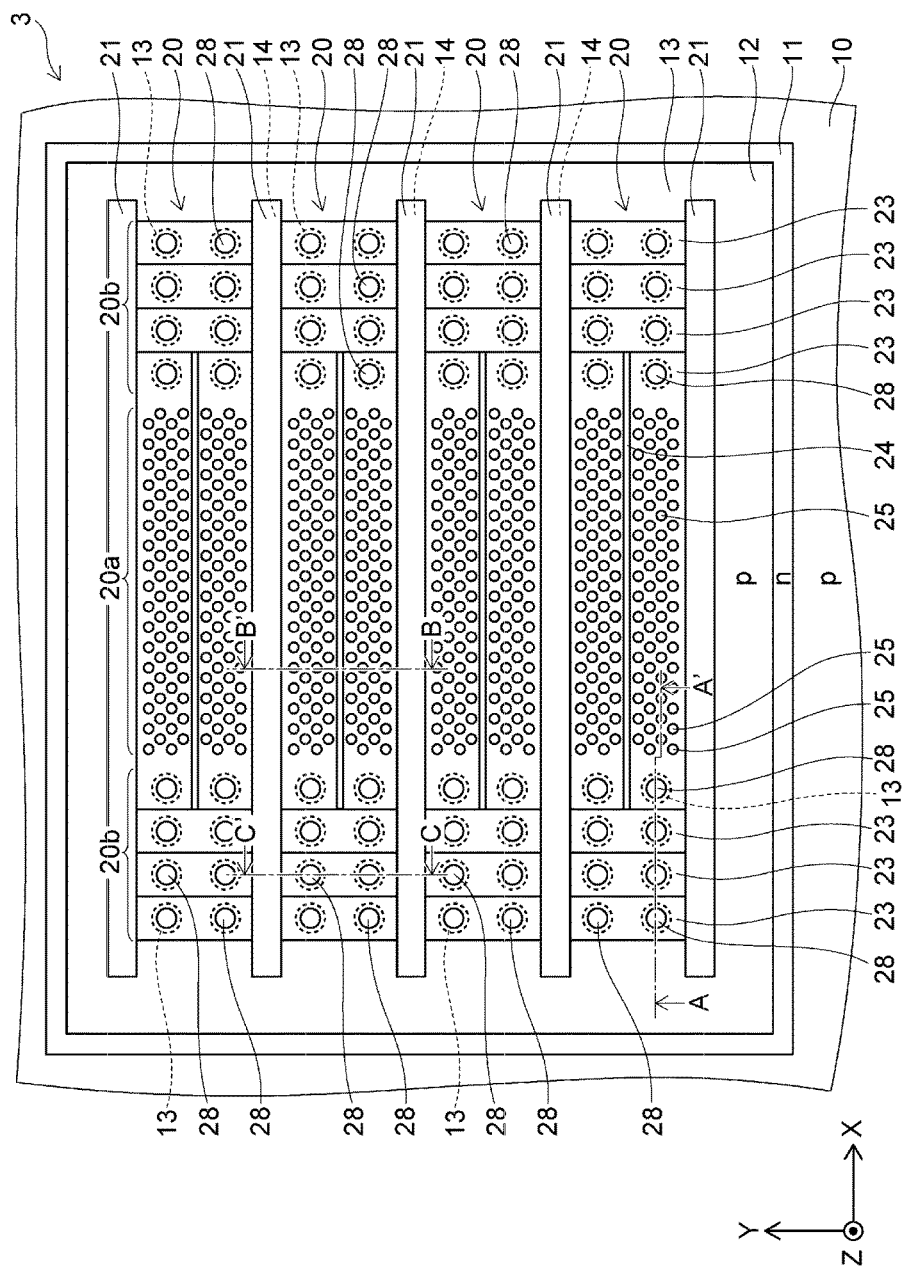
FIG. 7 is a plan view of a semiconductor memory device according to a third embodiment.

FIG. 7 is a plan view of a semiconductor memory device 3 according to the third embodiment.

Figure 8A:
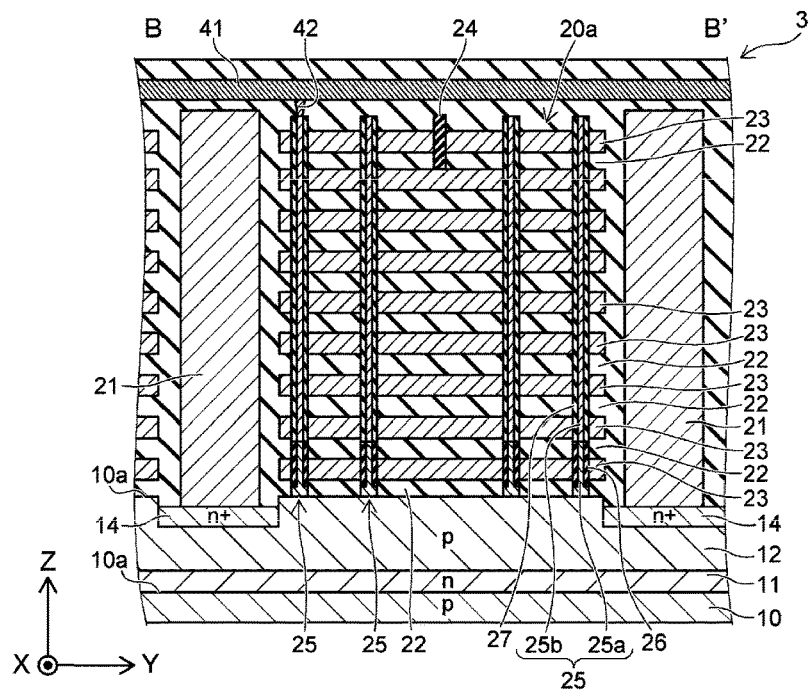
FIG. 8A is a cross-sectional view taken along line B-B' illustrated in FIG. 7.

FIG. 8A is a cross-sectional view taken along the line B-B' illustrated in FIG. 7. FIG. 8B is a cross-sectional view taken along the line C-C' illustrated in FIG. 7.

Figure 8B:
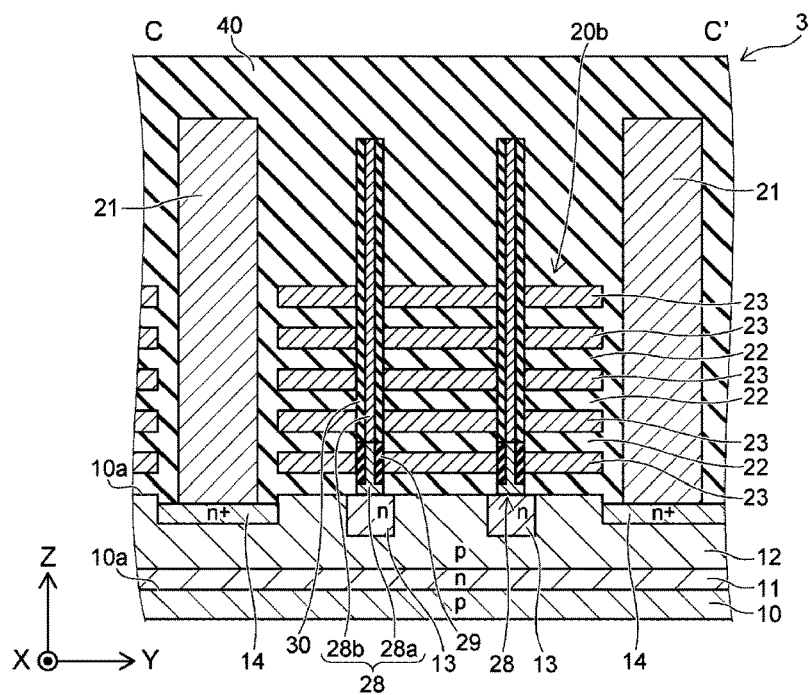
FIG. 8B is a cross-sectional view taken along line C-C' illustrated in FIG. 7.

As illustrated in FIG. 7 and FIGS. 8A and 8B, a semiconductor memory device 3 according to the third embodiment differs from the semiconductor memory device 1 (see FIGS. 1 to 4) according to the first embodiment described above in terms of a shape of the n-type region 13. In the third embodiment, the n-type region 13 is disposed in a region directly below each silicon pillar 28 and a periphery thereof in an upper part of a p-well 12. The plurality of n-type regions 13 is formed corresponding to the plurality of silicon pillars 28, and the n-type regions 13 are spaced from each other. Lower ends of the respective silicon pillars 28 are connected to the respective n-type regions 13. When viewed from the Z direction, all the n-type regions 13 are disposed inside an outer edge of the p-well 12. The n-type region 13 is not provided in a region directly below a silicon pillar 25, and a lower end of the silicon pillar 25 is connected to the p-well 12.

In the third embodiment, after holes for forming the silicon pillar 25 and the memory film 27 and holes for the silicon pillar 28 and the memory film 30 are formed in the stacked body 20, the cell portion 20a is covered with a resist film and an impurity serving as a donor is implanted into the upper part of the p-well 12, whereby the n-type region 13 is formed.

Configurations, operations, and effects other than those described above in the embodiment are the same as those in the first embodiment.

Fourth Embodiment

Hereinafter, a semiconductor memory device 4 according to a fourth embodiment will be described with reference to FIGS. 9A and 9B. The same reference numerals are used for the components that are substantially the same as those of the first embodiment, and the description of repeated components may be omitted.

Figure 9A:
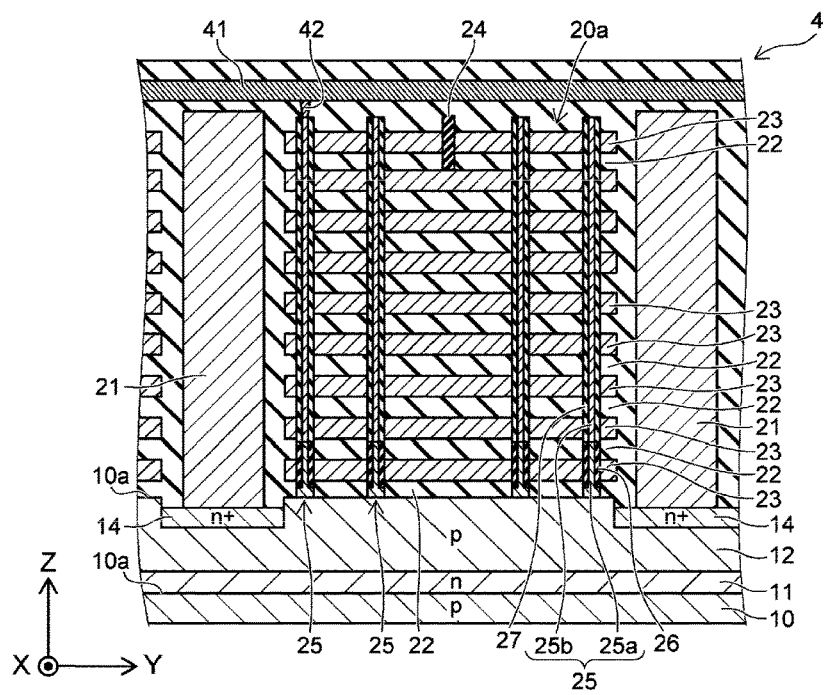
FIG. 9A is a cross-sectional view of a cell portion of a stacked body.
Figure 9B:
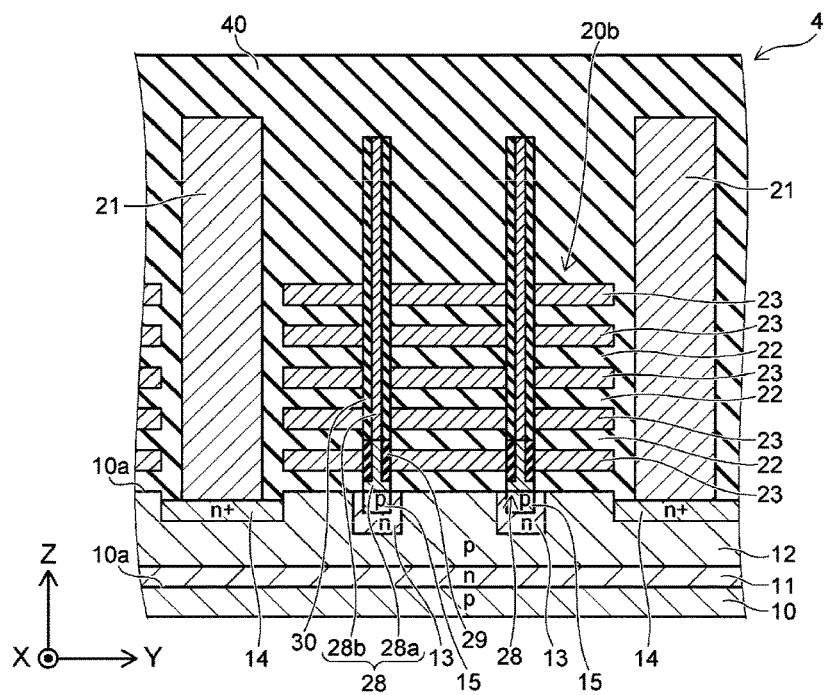
FIG. 9B is a cross-sectional view of an end of the stacked body.

FIGS. 9A and 9B are cross-sectional views illustrating a semiconductor memory device according to the fourth embodiment, wherein FIG. 9A is a cross-sectional view of a cell portion of a stacked body in the semiconductor memory device 4. FIG. 9B is a cross-sectional view of an end portion of the stacked body in the semiconductor memory device 4.

In a semiconductor memory device 4 according to the fourth embodiment, as illustrated in FIGS. 9A and 9B, a p-type region 15 having p-type conductivity is provided in an upper part of an n-type region 13 in addition to the configuration of the semiconductor memory device 3 (see FIGS. 7, 8A, and 8B) according to the third embodiment described above. When viewed from the Z direction, the p-type region 15 is disposed inside an outer edge of the n-type region 13, and is connected with a lower end of a silicon pillar 28.

In the semiconductor memory device 4 according to the fourth embodiment, when a ground potential is applied to an electrode film 23 and a positive erasing potential is applied to a p-well 12, a depletion layer is formed between the n-type region 13 and the p-type region 15. Thus, the erasing potential is not applied to the silicon pillar 28.

Configurations, operations, and effects other than those described above in the embodiment are the same as those in the third embodiment.

Fifth Embodiment

Hereinafter, a semiconductor memory device according to a fifth embodiment will be described with reference to FIG. 10. The same reference numerals are used for the components that are substantially the same as those of the first embodiment, and the description of repeated components may be omitted.

Figure 10:
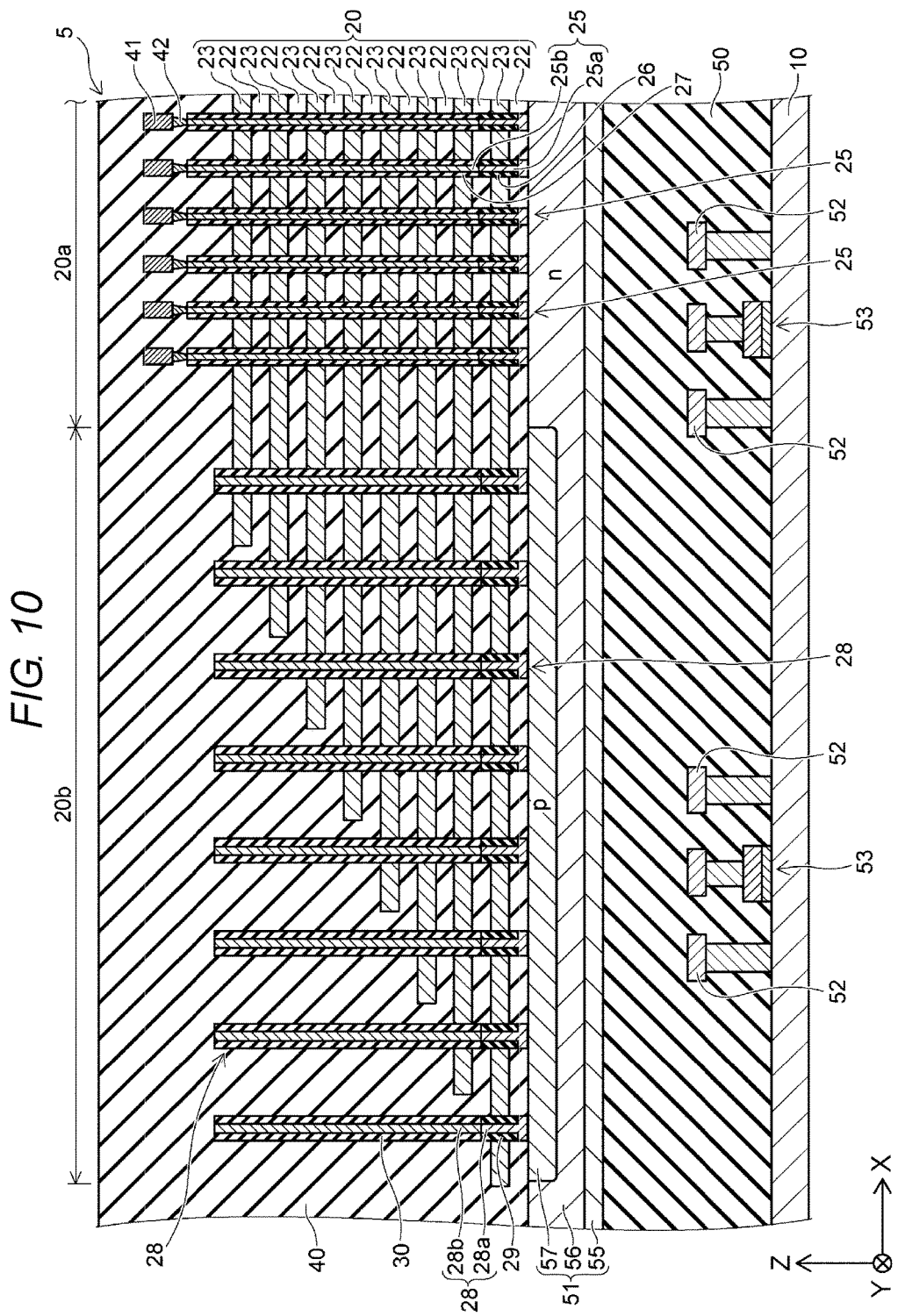
FIG. 10 is a cross-sectional view of a semiconductor memory device according to a fifth embodiment.

FIG. 10 is a cross-sectional view illustrating a semiconductor memory device according to the embodiment.

As illustrated in FIG. 10, a semiconductor memory device according to the fifth embodiment differs from the semiconductor memory device 1 (see FIGS. 1 to 4) according to the first embodiment described above in that an interlayer insulating film 50 and a buried source film 51 are provided between the silicon substrate 10 and the stacked body 20 and that the conductive plate 21 (see FIGS. 1, 3A, and 3B) is not provided.

Circuit elements such as CMOS 53 and interconnects 52 are provided on an upper surface of the silicon substrate 10 and in the interlayer insulating film 50, thereby constituting a peripheral circuit. The buried source film 51 is disposed on the interlayer insulating film 50. A potential is supplied to the buried source film 51 from the peripheral circuit.

In the buried source film 51, a metal layer 55 is provided and an n-type silicon layer 56 having n-type conductivity is provided on the metal layer 55. A p-type silicon layer 57 having p-type conductivity is provided in an upper part of the n-type silicon layer 56. When viewed from the Z direction, the p-type silicon layer 57 is disposed in a region directly below both end portions 20b of a stacked body 20, but is not disposed in a region directly below a cell portion 20a. For this reason, a lower end of a silicon pillar 28 is connected to the p-type silicon layer 57, and a lower end of a silicon pillar 25 is connected to the n-type silicon layer 56.

An operation of the semiconductor memory device 5 according to the fifth embodiment will be described below.

In the semiconductor memory device 5, a positive erasing potential is supplied to the metal layer 55 of the buried source film 51 from the peripheral circuit at the time of an erasing operation, and a high voltage is applied between the n-type silicon layer 56 and the i-type silicon pillar 25. Thus, gate-induced drain leakage (GIDL) occurs near an interface between the n-type silicon layer 56 and the silicon pillar 25, and positive holes are supplied into the silicon pillar 25. Then, the positive holes stored in the silicon pillar 25 are injected into a charge storage film 33 via a tunnel insulating film 32, whereby electrons stored in the charge storage film 33 are eliminated and data of the memory cell is erased.

The n-type silicon layer 56 and the p-type silicon layer 57 are interposed between the metal layer 55 and the silicon pillar 28. When a positive erasing potential is applied to the metal layer 55, a depletion layer is formed starting from an interface between the n-type silicon layer 56 and the p-type silicon layer 57. For this reason, the erasing potential is not transmitted up to the silicon pillar 28. Thus, it is possible to avoid a high voltage from being applied between the silicon pillar 28 and the electrode film 23 and to prevent the damage of the memory film 30.

Effects of the embodiment will be described.

In the semiconductor memory device 5 according to the fifth embodiment in which the peripheral circuit is disposed between the silicon substrate 10 and the stacked body 20 and a potential is supplied to the lower end of the silicon pillar 25 via the buried source film 51, the p-type silicon layer 57 is provided in the region directly below the silicon pillar 28 in the buried source film 51, whereby the erasing potential can be prevented from being transmitted to the silicon pillar 28 and the damage of the memory film 30 can be prevented.

Configurations, operations, and effects other than those described above in the embodiment are the same as those in the first embodiment.

Sixth Embodiment

Hereinafter, a semiconductor memory device according to a sixth embodiment will be described with reference to FIGS. 11, 12A, and 12B. The same reference numerals are used for the components that are substantially the same as those of the first embodiment, and the description of repeated components may be omitted.

Figure 11:
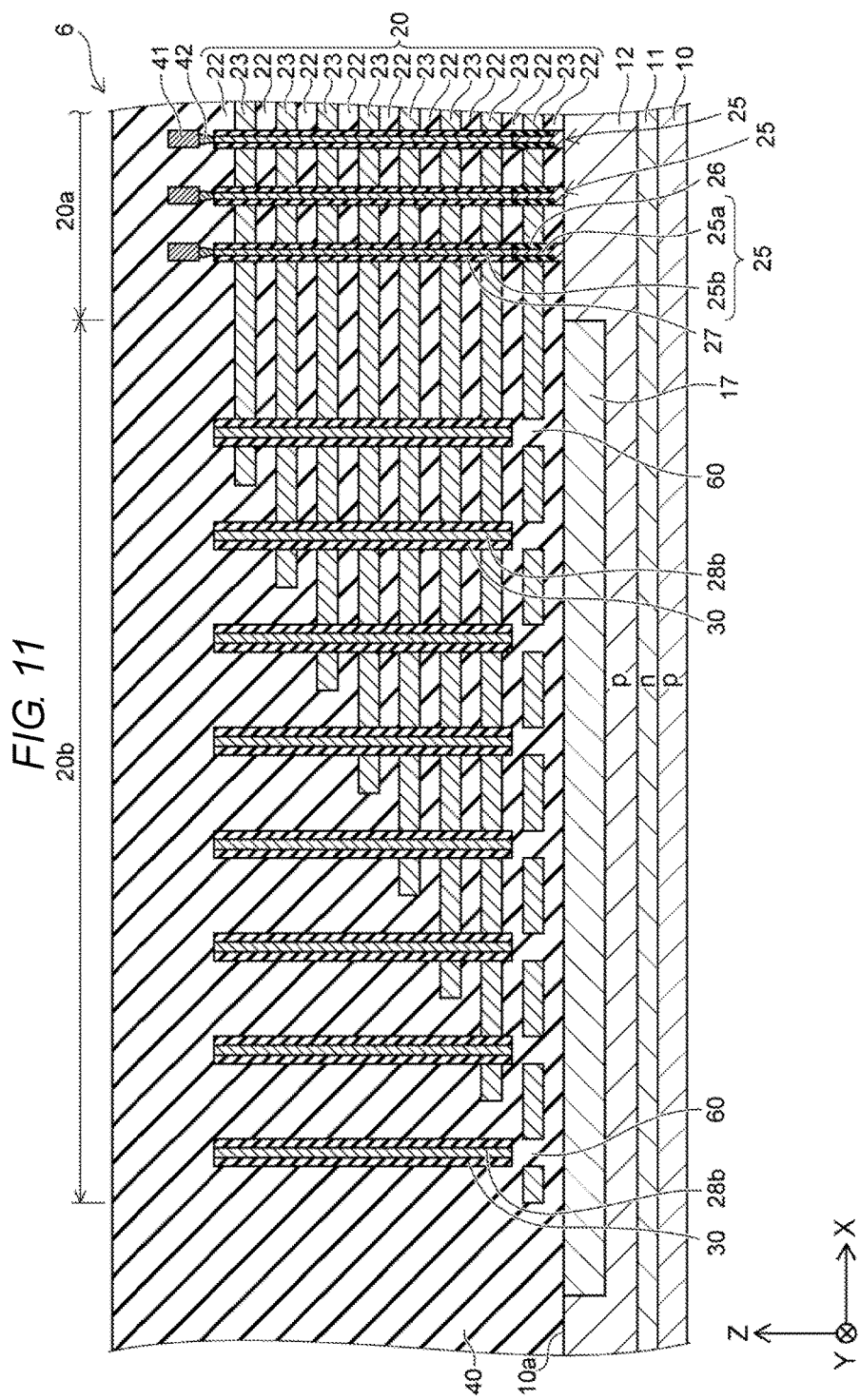
FIG. 11 is a cross-sectional view of a semiconductor memory device according to a sixth embodiment.

FIG. 11 is a cross-sectional view of a semiconductor memory device 6 according to the sixth embodiment.

Figure 12A:
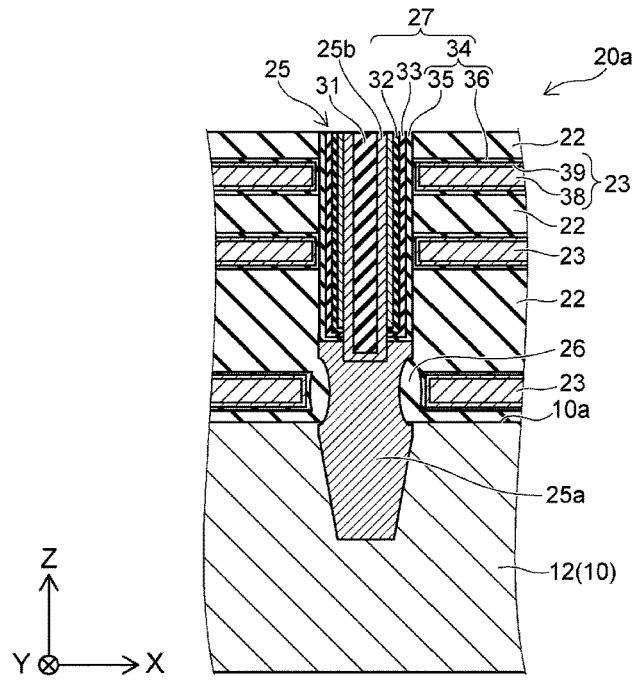
FIG. 12A is a cross-sectional view of a cell portion of a stacked body.

FIG. 12A is a cross-sectional view of a cell portion of a stacked body in the semiconductor memory device 6. FIG. 12B is a cross-sectional view of an end portion of the stacked body in the semiconductor memory device 6.

Figure 12B:
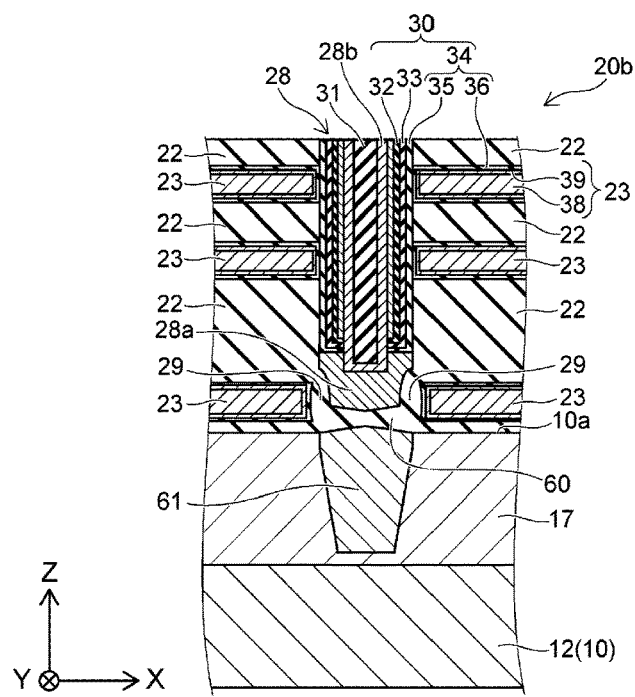
FIG. 12B is a cross-sectional view of an end of the stacked body.

In a semiconductor memory device 6 according to the sixth embodiment, as illustrated in FIG. 11 and FIGS. 12A and 12B, an impurity-containing layer 17 containing arsenic (As) is formed in an upper part of a p-well 12. The impurity-containing layer 17 may contain germanium (Ge) instead of arsenic. When viewed from the Z direction, the impurity-containing layer 17 is disposed in a region directly below both end portions 20b of a stacked body 20.

A silicon pillar 25 has substantially the same configuration as in the first embodiment described above. A lower portion 25a of the silicon pillar 25 is disposed in the p-well 12 of the silicon substrate 10 and is connected to the p-well 12.

A silicon pillar 28 is spaced from the silicon substrate 10, and a silicon oxide member 60 is provided between the silicon pillar 28 and the silicon substrate 10. Thus, the silicon pillar 28 is insulated from the silicon substrate 10. A silicon member 61 is provided in a region directly below the silicon oxide member 60 in the impurity-containing layer 17. The silicon member 61 epitaxially grows with respect to the silicon substrate 10, and is integrated with the silicon substrate 10. An upper end of the silicon member 61 protrudes upward with respect to an upper surface of a portion of the silicon substrate 10 in which the silicon member 61 is not provided. That is, a region corresponding to the region directly below the silicon pillar 28 in an upper surface 10a of the silicon substrate 10 including the silicon member 61 is located above a region around the region directly below the silicon pillar 28 in the upper surface 10a.

A lower portion 28a of the silicon pillar 28 and the silicon member 61 also contains arsenic, but have an arsenic concentration lower than that in the impurity-containing layer 17. In addition, arsenic is not substantially contained in the upper portion 28b of the silicon pillar 28 and the lower portion 25a and the upper portion 25b of the silicon pillar 25. Accordingly, a concentration of arsenic in the portion of the silicon substrate 10 corresponding to the region directly below the silicon pillar 28 is higher than that of arsenic in the portion of the silicon substrate 10 corresponding to the region directly below silicon pillar 25.

A method of manufacturing the semiconductor memory device 6 according to the sixth embodiment will be described below.

FIGS. 13A and 13B and FIGS. 14A and 14B are cross-sectional views illustrating the method of manufacturing the semiconductor memory device 6 according to the sixth embodiment.

Figure 13A:
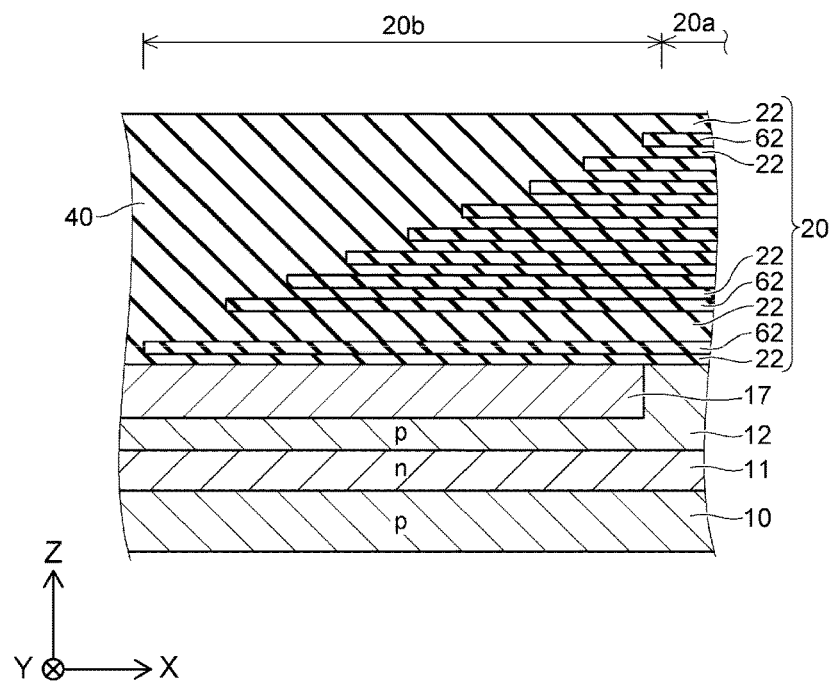
FIGS. 13A and 13B are cross-sectional views illustrating a method of manufacturing a semiconductor memory device according to the sixth embodiment.

In Step 1, as illustrated in FIG. 13A, an n-well 11 and a p-well 12 are formed in the upper part of the silicon substrate 10. In Step 2, arsenic ions are implanted into the upper part of the p-well 12 to form the impurity-containing layer 17. The impurity-containing layer 17 is formed in a region which is located directly below the end 20b when the stacked body 20 is formed.

In Step 3, an insulating film 20 formed of silicon oxide and a silicon nitride film 62 are alternately formed to form the stacked body 20. In Step 4, both end portions 20b in the X direction of the stacked body 20 are processed in a staircase shape in which a terrace is provided for each silicon nitride film 62. In Step 5, silicon oxide is deposited, and an interlayer insulating film 40 is formed so as to cover the stacked body 20.

Figure 13B:
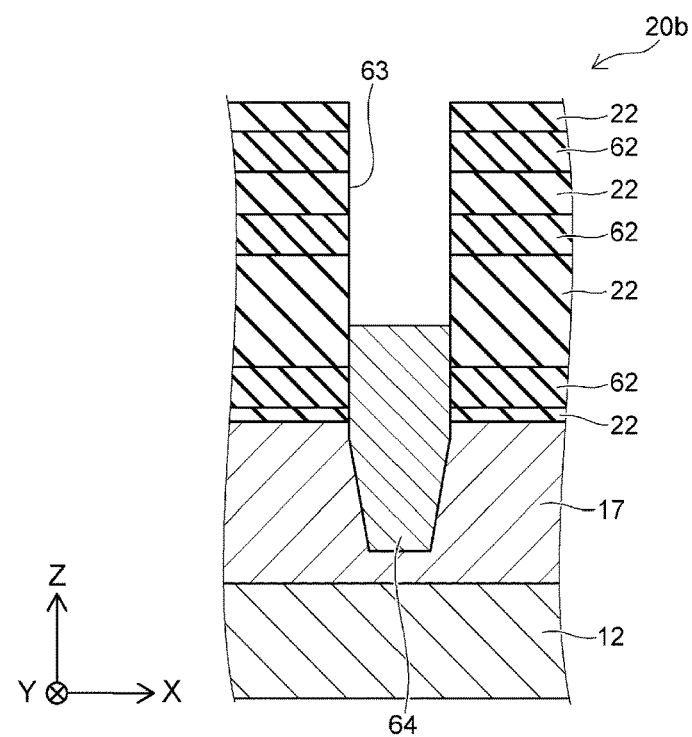

In Step 6, as illustrated in FIG. 13B, a memory hole 63 is formed in a region of the stacked body 20 where the silicon pillar 25 is to be formed in and a region where the silicon pillar 28 is to be formed. The memory hole 63 reaches the silicon substrate 10, and a lower end of the memory hole 63 is located in the silicon substrate 10. At this time, the lower end of the memory hole 63 formed for the silicon pillar 25 is located in the p-well 12, and the lower end of the memory hole formed for the silicon pillar 28 is located in the impurity-containing layer 17.

In Step 7, silicon epitaxially grows starting from the silicon substrate 10, in a lower portion of the memory hole 63. Thus, an epitaxial silicon member 64 is formed. The epitaxial silicon member 64 is surrounded by the lowermost silicon nitride film 62.

Figure 14A:
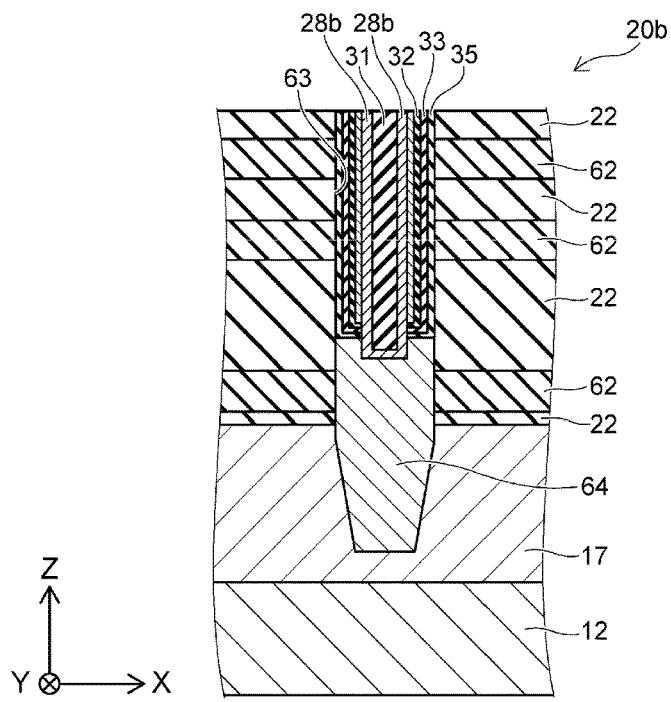
FIGS. 14A and 14B are cross-sectional views illustrating a method of manufacturing a semiconductor memory device according to the sixth embodiment.

In Step 8, as illustrated in FIG. 14A, the silicon oxide layer 35, the charge storage film 33, the tunnel insulating film 32, the upper portion 25b (see FIG. 11) of the silicon pillar 25 or the upper portion 28b of the silicon pillar 28, and the core member 31 are formed on the epitaxial silicon member 64 in the memory hole 63. By heat treatment accompanying this process, arsenic diffuses from the impurity-containing layer 17 into the epitaxial silicon member 64 disposed directly below the silicon pillar 28.

Figure 14B:
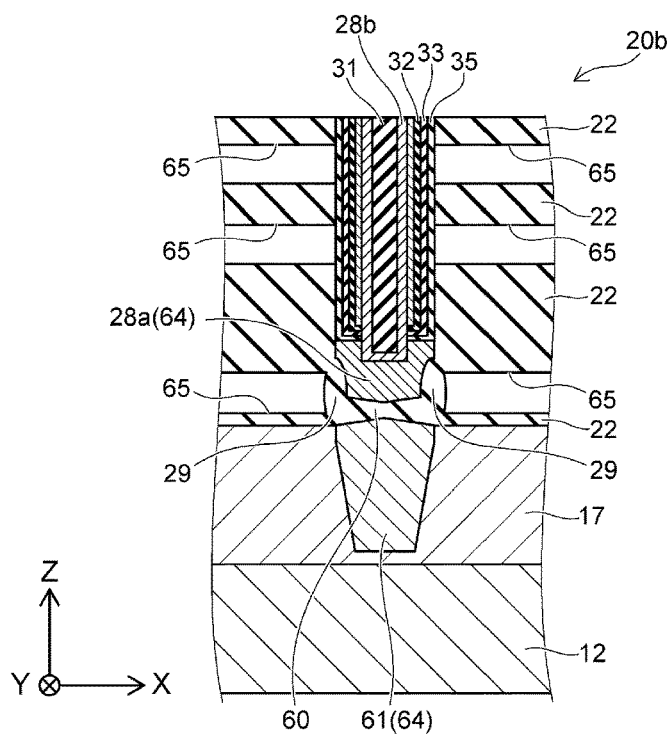

In Step 9, as illustrated in FIG. 14B, a slit (not illustrated) extending in the X direction is formed in the stacked body 20. Subsequently, the silicon nitride film 62 is removed through the slit. After the silicon nitride film 62 is removed in this manner, a space 65 is formed. The silicon oxide layer 35 and the epitaxial silicon member 64 are exposed on an innermost surface of the space 65.

In Step 10, thermal oxidation treatment is performed. Thus, a part of the epitaxial silicon member 64 exposed in the space 65 is oxidized. At this time, since the epitaxial silicon member 64 disposed directly below the silicon pillar 25 contains substantially no impurity, only a lateral portion is oxidized, and the silicon oxide film 29 (see FIG. 11) is formed.

Since the epitaxial silicon member 64 disposed directly below the silicon pillar 28 contains arsenic, thermal oxidation is promoted. Thus, an oxidation reaction proceeds to the center of the epitaxial silicon member 64, and a silicon portion is vertically divided. As a result, an upper portion of an unoxidized portion of the epitaxial silicon member 64 becomes the lower portion 28a of the silicon pillar 28, and a lower portion thereof becomes the silicon member 61. Further, the silicon oxide member 60 is formed between the lower portion 28a and the silicon member 61, and the silicon oxide film 29 is formed around the silicon oxide member 60 and the lower portion 28a.

In Step 11, the aluminum oxide layer 36, the barrier metal layer 39, and the main body 38 are formed through the slit. The electrode film 23 is formed by the barrier metal layer 39 and the main body 38. Subsequently, an insulating film (not illustrated) is formed on a side surface of the slit. In Step 12, the conductive plate 21 (see FIG. 1) is formed in the slit. The lower end of the conductive plate 21 is connected to the silicon substrate 10. In Step 13, the upper surface interconnects such as the plug 42 and the bit line 41 (see FIG. 11) are formed. In this manner, the semiconductor memory device 6 according to the sixth embodiment is manufactured.

Effects of the sixth embodiment will be described.

According to the sixth embodiment, the impurity-containing layer 17 containing arsenic is formed in the region directly below the end 20b of the stacked body 20 in the process illustrated in FIG. 13A. For this reason, when heat treatment is performed in the process illustrated in FIG. 14A, arsenic diffuses into the epitaxial silicon member 64 formed in the end 20b. Thus, when the epitaxial silicon member 64 is subjected to the thermal oxidation treatment in the process illustrated in FIG. 14B, the epitaxial silicon member formed in the region directly below the end 20b is acceleratedly oxidized, and is vertically divided. Only a lateral portion of the epitaxial silicon member 64 formed in the region directly below the cell portion 20a is oxidized, and the center thereof remains.

As a result, while the silicon pillar 25 formed in the cell portion 20a is connected to the silicon substrate 10, the silicon pillar 28 formed at the end 20b can be insulated from the silicon substrate 10. Thus, even when the erasing potential of the silicon substrate 10 is applied, the erasing potential is not applied to the silicon pillar 28, and the high voltage can be avoided from being applied between the silicon pillar 28 and the electrode film 23. As a result, the damage of the memory film 30 can be prevented, and the reliability of the semiconductor memory device 6 can be maintained high.

Configurations, operations, and effects other than those described above in the embodiment are the same as those in the first embodiment.

Seventh Embodiment

Hereinafter, a semiconductor memory device according to a seventh embodiment will be described with reference to FIGS. 15A and 15B. The same reference numerals are used for the components that are substantially the same as those of the first embodiment, and the description of repeated components may be omitted.

Figure 15A:
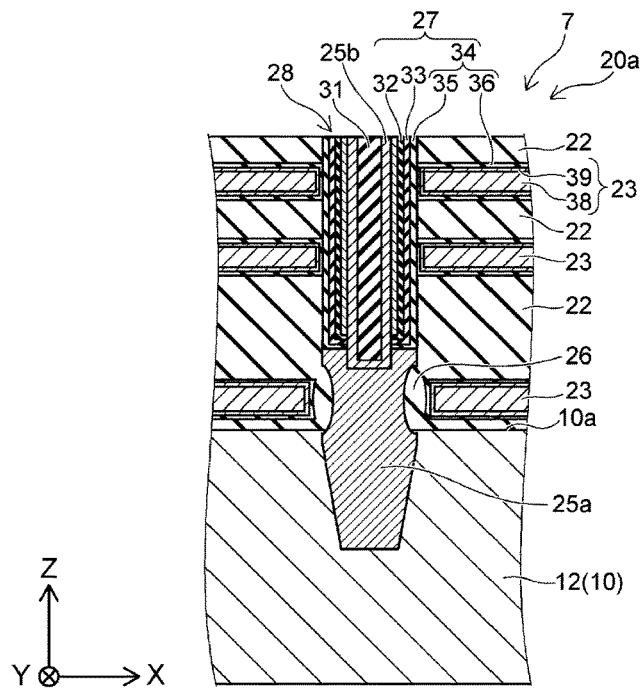
FIG. 15A is a cross-sectional view of a cell portion of a stacked body.
Figure 15B:
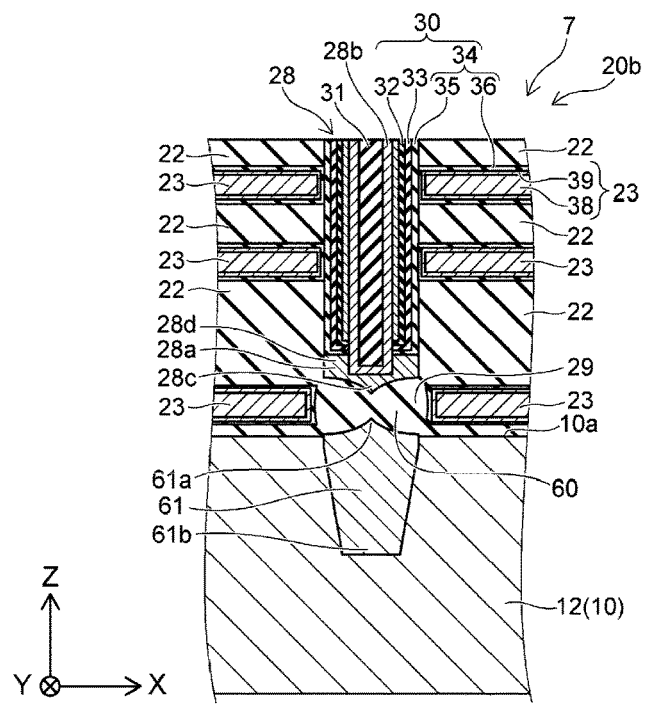
FIG. 15B is a cross-sectional view of an end of the stacked body.

FIGS. 15A and 15B are cross-sectional views illustrating a semiconductor memory device according to the embodiment, wherein FIG. 15A illustrates a cell portion of a stacked body and FIG. 15B illustrates an end portion of the stacked body.

As illustrated in FIG. 15A, a silicon pillar 25 in a semiconductor memory device 7 according to the seventh embodiment has the same configuration as in the sixth embodiment (see FIG. 12A) described above.

Even in the seventh embodiment, as illustrated in FIG. 15B, a silicon pillar 28 is spaced from a silicon substrate 10 as in the sixth embodiment. It should be noted that, unlike the sixth embodiment, the impurity-containing layer 17 is not provided in this seventh embodiment. An arsenic concentration in a lower portion 28a of the silicon pillar 28 and an arsenic concentration in a silicon member 61 are higher than an arsenic concentration in the silicon substrate 10. Further, an arsenic concentration in a lower end 28c of the lower portion 28a is higher than an arsenic concentration in an upper end 28d, and an arsenic concentration in an upper end 61a of the silicon member 61 is higher than an arsenic concentration in a lower end 61b.

A method of manufacturing the semiconductor memory device according to the seventh embodiment will be described below.

FIGS. 16A and 16B and FIGS. 17A and 17B are cross-sectional views illustrating the method of manufacturing the semiconductor memory device 7 according to the seventh embodiment.

Figure 16A:
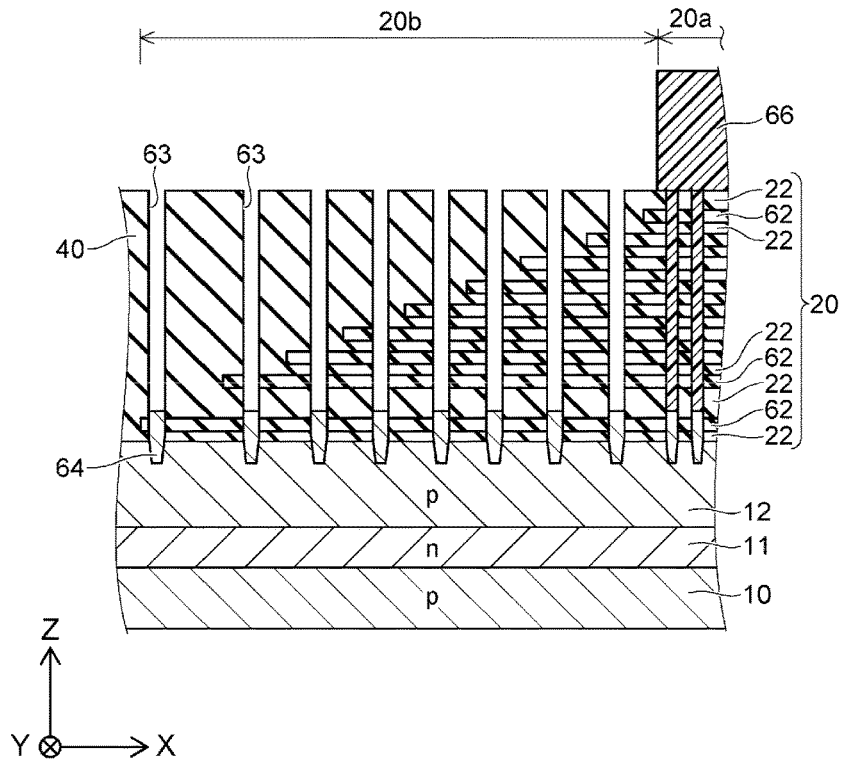
FIGS. 16A and 16B are cross-sectional views illustrating a method of manufacturing a semiconductor memory device according to the seventh embodiment.

In Step 1, as illustrated in FIG. 16A, an n-well 11 and a p-well 12 are formed in the upper part of the silicon substrate 10. In Step 2, an insulating film 22 formed of silicon oxide and a silicon nitride film 62 are alternately formed to form the stacked body 20. Subsequently, both end portions 20b in the X direction of the stacked body 20 are processed in a staircase shape in which a terrace is provided for each silicon nitride film 62. In Step 3, silicon oxide is deposited, and an interlayer insulating film 40 is formed so as to cover the stacked body 20.

In Step 4, a memory hole 63 is formed in a region of the stacked body 20 where the silicon pillar 25 is to be formed in and a region where the silicon pillar 28 is to be formed. A lower end of the memory hole 63 is located in the p-well 12. In Step 5, silicon epitaxially grows in a lower portion of the memory hole 63 to form an epitaxial silicon member 64. Subsequently, a resist mask 66 is formed so as to cover the cell portion 20a of the stacked body 20. At this time, an end 20b of the stacked body 20 is not covered with the resist mask 66.

Figure 16B:
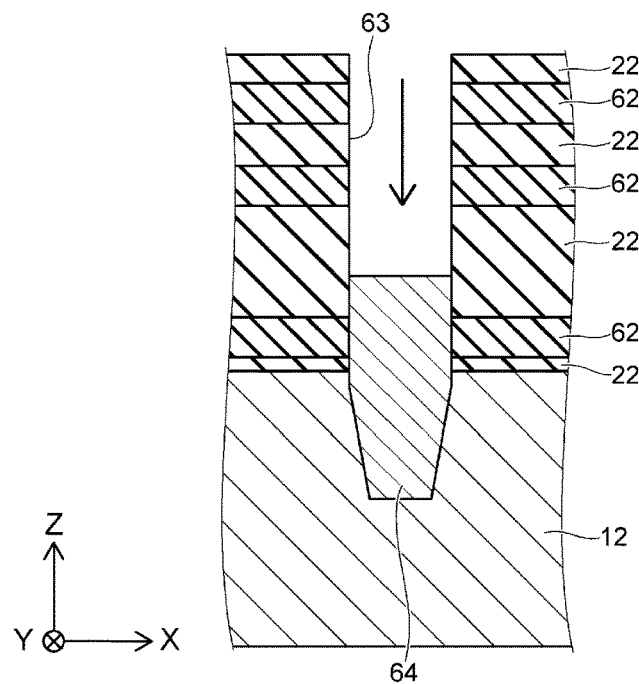

In Step 6, as illustrated in FIG. 16B, arsenic ions are implanted. Thus, arsenic is introduced into the epitaxial silicon member 64 formed in the end 20b of the stacked body 20. At this time, it is preferable to make the arsenic concentration in a portion surrounded by the lowermost silicon nitride film 62 in the epitaxial silicon member 64 higher than the arsenic concentration in portions which are disposed above and below the epitaxial silicon member 64 by adjustment of an acceleration voltage of ion implantation. Thereafter, the resist mask 66 is removed.

Figure 17A:
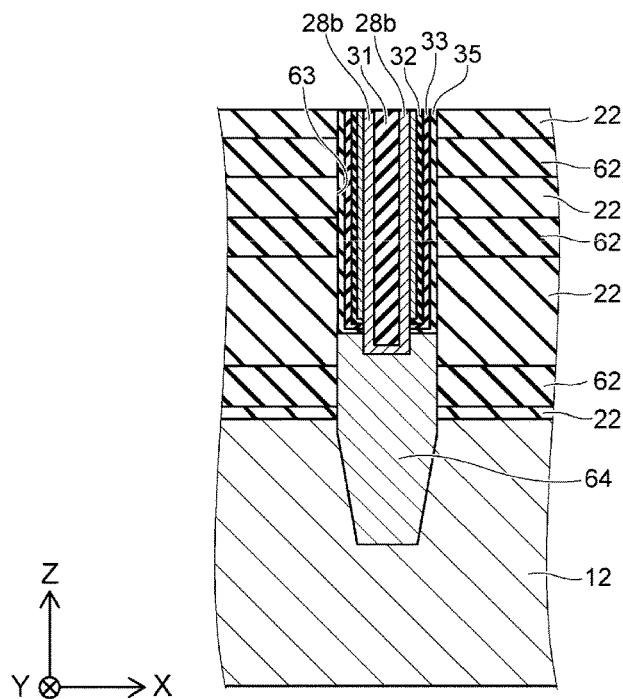
FIGS. 17A and 17B are cross-sectional views illustrating a method of manufacturing a semiconductor memory device according to the seventh embodiment.

In Step 7, as illustrated in FIG. 17A, the silicon oxide layer 35, the charge storage film 33, the tunnel insulating film 32, the upper portion 25b (see FIG. 11) of the silicon pillar 25 or the upper portion 28b of the silicon pillar 28, and the core member 31 are formed on the epitaxial silicon member 64 in the memory hole 63.

Figure 17B:
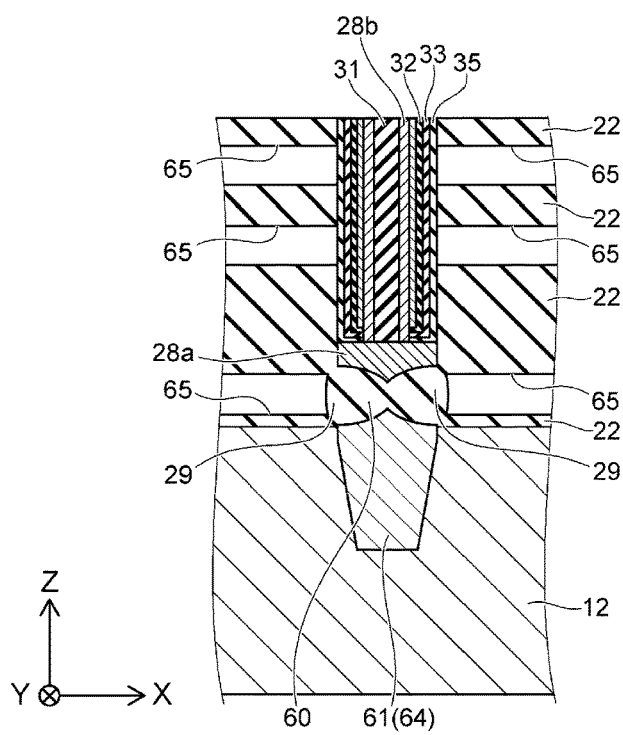

In Step 8, as illustrated in FIG. 17B, a slit (not illustrated) extending in the X direction is formed in the stacked body 20. In Step 9, subsequently, the silicon nitride film 62 is removed through the slit. After the silicon nitride film 62 is removed in this manner, a space 65 is formed. The silicon oxide layer 35 and the epitaxial silicon member 64 are exposed on an innermost surface of the space 65.

In Step 10, thermal oxidation treatment is performed. Thus, a portion of the epitaxial silicon member 64 exposed in the space 65 is oxidized. At this time, only a lateral portion of the epitaxial silicon member 64 disposed directly below the silicon pillar 25 is oxidized, and the silicon oxide film 29 (see FIG. 11) is formed. On the other hand, since the epitaxial silicon member 64 disposed directly below the silicon pillar 28 contains arsenic, thermal oxidation is promoted, whereby the silicon oxide member 60 is formed. As a result, the epitaxial silicon member 64 is divided by the lower portion 28a of the silicon pillar 28 and the silicon member 61. The subsequent processes are the same as in the sixth embodiment described above.

According to the seventh embodiment, since the silicon pillar 28 is also insulated from the silicon substrate 10, no erasing potential is applied to the silicon pillar 28. Consequently, the memory film 30 is less likely to be damaged by the application of a voltage, and reliability is high.

Configurations, operations, and effects other than those described above in the embodiment are the same as those in the sixth embodiment.

In the sixth and seventh embodiments described above, arsenic or germanium is used as an example of impurity for promoting oxidation. However, impurities are not limited to these examples and may be any materials that promotes oxidation of silicon.

According to the embodiments described above, the semiconductor memory device having high reliability can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first semiconductor well of a first conductivity type in a memory cell region and a contact region of a substrate;
a second semiconductor well of a second conductivity type in the first semiconductor well in the contact region;
a plurality of electrode films stacked on the first semiconductor well and spaced from one another in a first direction, the plurality of electrode films extending in a second direction within the memory cell region into the contact region;
a first semiconductor pillar extending in the second direction through the plurality of electrode films in the memory cell region;
a second semiconductor pillar extending in the second direction through at least one electrode film of the plurality in the contact region;
a charge storage film between the first semiconductor pillar and each electrode film of the plurality;
an insulating film between the second semiconductor pillar and the at least one electrode film of the plurality; and
a third semiconductor well of the first conductivity type in the second semiconductor well, the second semiconductor well being between the first and third semiconductor wells, wherein
a lower end portion of the second semiconductor pillar along the first direction directly contacts the third semiconductor well.

2. The semiconductor memory device according to claim 1, further comprising:
a conductive plate on the first semiconductor well and adjacent to the plurality of electrode films in a third direction within both the memory cell region and the contact region, wherein
the conductive plate is electrically connected to the first semiconductor well.

3. The semiconductor memory device according to claim 1, wherein the first conductivity type is a p type, and the second conductivity type is an n type.

4. The semiconductor memory device according to claim 1, wherein the second semiconductor pillar has a lower portion and an upper portion on the lower portion, the lower portion extends through a lowermost electrode film of the plurality of electrode film and is coated with an insulating film, and the upper portion comprises a semiconductor core coated with a charge trap film.

5. A semiconductor memory device, comprising:
a first semiconductor well of a first conductivity type in a memory cell region and a contact region of a substrate;
a second semiconductor well of a second conductivity type in the first semiconductor well in the contact region;
a plurality of electrode layers stacked on a substrate in a first direction, spaced from each in the first direction, and extending in a second direction from the memory cell region into the contact region;
a first semiconductor pillar in the memory cell region and extending through the plurality of electrode layers in a third direction to the first semiconductor well, a charge trap film coating an outer surface of the first semiconductor pillar between the first semiconductor pillar and each electrode layer of the plurality;
a second semiconductor pillar in the contact region extending in the third direction through at least one electrode layer in the plurality to the substrate, an insulating film coating an outer surface of the second semiconductor pillar between the second semiconductor pillar and the at least one electrode layer; and
a third semiconductor well of the first conductivity type in the second semiconductor well, the second semiconductor well being between the first and third semiconductor wells, wherein
a lower end portion of the second semiconductor pillar along the first direction directly contacts the third semiconductor well.

6. The semiconductor memory device according to claim 5, further comprising:
a conductive plate electrically connected to the first semiconductor well and adjacent to the plurality of electrode films within both the memory cell region and the contact region.

7. The semiconductor memory device according to claim 5, wherein the first conductivity type is a p type, and the second conductivity type is an n type.

8. A semiconductor memory device, comprising:
a first semiconductor well of a first conductivity type in a memory cell region and a contact region of a substrate;
a second semiconductor well of a second conductivity type in the first semiconductor well in the contact region;
a plurality of electrode films stacked on the first semiconductor well and spaced from one another in a first direction, the plurality of electrode films extending in a second direction within the memory cell region into the contact region;

a first semiconductor pillar extending in the second direction through the plurality of electrode films in the memory cell region;

a second semiconductor pillar extending in the second direction through at least one electrode film of the plurality in the contact region;

a charge storage film between the first semiconductor pillar and each electrode film of the plurality;

an insulating film between the second semiconductor pillar and the at least one electrode film of the plurality;

an interlayer insulating film between the substrate and the first semiconductor well in the first direction, wherein the first conductivity type is an n type, and the second conductivity type is a p type, the first semiconductor pillar contacts the first semiconductor well, and the second semiconductor pillar contacts the second semiconductor well.

9. The semiconductor memory device according to claim 8, wherein the second semiconductor pillar has a lower portion and an upper portion on the lower portion, the lower portion extends through a lowermost electrode film of the plurality of electrode film and is coated with an insulating film, and the upper portion comprises a semiconductor core coated with a charge trap film.

* * * * *